United States Patent
Lee et al.

(10) Patent No.: US 6,622,274 B1
(45) Date of Patent: Sep. 16, 2003

(54) METHOD OF MICRO-ARCHITECTURAL IMPLEMENTATION ON BIST FRONTED STATE MACHINE UTILIZING 'DEATH LOGIC' STATE TRANSITION FOR AREA MINIMIZATION

(75) Inventors: Weng F. Lee, Penang (ML); Colin S. Bill, Cupertino, CA (US); Feng Pan, San Jose, CA (US); Edward V. Bautista, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 461 days.

(21) Appl. No.: 09/655,335

(22) Filed: Sep. 5, 2000

(51) Int. Cl.[7] .................. G11C 29/00; G01R 31/28; G01R 31/3187
(52) U.S. Cl. .................. 714/733; 714/718; 714/734
(58) Field of Search ................... 714/718, 733, 714/734

(56) References Cited

U.S. PATENT DOCUMENTS 5,138,619 A * 8/1992 Fasang et al. .............. 714/718
5,349,587 A * 9/1994 Nadeau-Dostie et al. ... 714/729
6,374,370 B1 * 4/2002 Bockhaus et al. ............ 714/39
6,408,413 B1 * 6/2002 Whetsel ...................... 714/727
6,415,403 B1 * 7/2002 Huang et al. ................ 714/726
6,425,103 B1 * 7/2002 Phan .......................... 714/733

* cited by examiner

*Primary Examiner*—Phung M. Chung
*Assistant Examiner*—Cynthia Britt
(74) *Attorney, Agent, or Firm*—Davis Chin

(57) ABSTRACT

There is provided an improve BIST frontend state machine and a method for micro-architectural implementation of the same which is achieved with a minimal amount of test logic circuitry. The state frontend machine includes a state controller responsive to clock signals, control signals, and output register signals for generating output state signals based upon a fixed number of states utilizing death logic so as to sequence through one of a plurality of sets of tests until completed or failed. A substantial savings of approximately 40% in the I.C. chip area was realized in comparison to the implementation by a conventional state machine.

2 Claims, 9 Drawing Sheets

METHOD OF MICRO-ARCHITECTURAL IMPLEMENTATION ON BIST FRONTED STATE MACHINE UTILIZING 'DEATH LOGIC' STATE TRANSITION FOR AREA MINIMIZATION

BACKGROUND OF THE INVENTION

This invention relates generally to advanced flash IC (integrated circuit) chips which includes a state machine for performing built-in self-test functions. More particularly, the present invention relates to an improved built-in self-test frontend state machine and a method for micro-architectural implementation of the same which is achieved with a minimal amount of test logic circuitry.

As is generally well-known, flash IC chips have become widely used in almost all forms of electronic devices such as cell-phones, digital camera, computers, PDA and many others. As flash memory IC chips are being used more and more, there has been a growing trend of requiring increased demands from flash designers in many characteristics of the flash manufacturing processes, such as reliability.

For example, since these flash IC chips are quite complex in nature, flash chips manufacturers have to manually test these chips before they are being shipped to customers. This process of manual testing is tedious and requires much effort, not to mention the high cost involved. With this in mind, flash chips manufacturers have implemented a method of built-in self-test circuitry on the flash memory IC chip so as to perform internal hardware tests on the various types of integrated circuits associated with the flash chip before they are shipped to the customers. This built-in self-test would make all the necessary tests on its own with only a minimal external hardware and minimal manual supervision. This capability of having built-in self-test circuitry eliminates the need of expensive hardware testers which greatly increases the overall manufacturing cost.

It is already known that a conventional state machine could be used to implement the logic functionality of a built-in self-test (BIST) frontend state machine for performing a sequence of logic states so as to control the testing process. A flow chart illustrating the logic functionality required to be implemented for the BIST frontend state machine is shown in FIG. 1. Unfortunately, the use of the conventional state machine to perform this functionality would require a large amount of logic gates in view of the many different states as well as the many different logic gates required to be implemented for each of the decision blocks. Thus, the conventional state machine approach suffers from the disadvantages of being too large and requiring a relatively large amount of chip area or real estate on a silicon I.C. chip or die containing the state machine.

Therefore, it would be desirable to provide an improved built-in self-test frontend state machine which performs the same logic functionality of the BIST frontend sequencing of states while minimizing the number of electrical circuit components. This is accomplished in the present invention by the provision of a state controller for generating output state signals based upon a fixed number of states utilizing "death logic" state transition.

SUMMARY OF THE INVENTION

Accordingly, it is a general object of the present invention to provide an improved built-in self-test frontend state machine and a method for micro-architectural implementation of the same.

It is another object of the present invention to provide an improved built-in self-test frontend state machine which is achieved with a minimal amount of test logic circuitry.

It is another object of the present invention to provide an improved built-in self-test frontend state machine which minimizes the test logic circuitry required to implement the BIST functionality by utilizing a "death logic" state transition technique.

It is still another object of the present invention to provide an improved built-in self-test frontend state machine which includes a state controller for generating output state signals based upon a fixed number of states so as to sequence through a set of tests to be executed.

In a preferred embodiment of the present invention, there is provided an improved BIST frontend state machine which includes a shift register which is responsive to values inputted by a user for generating output register signals corresponding to which one of a plurality of sets of tests are to be executed. A clock module is provided for generating two-phase non-overlapping clock signals. A backend state machine is provided for generating control signals indicative of whether an individual test is still being executed, has been completed, or has failed.

A state controller is responsive to the clock signals, control signals, and output register signals for generating output state signals based upon a-fixed number of states utilizing death logic transitions so as to sequence through the one of the plurality of sets of tests until completed or failed. A logic module is used to generate output test signals required for each individual test of the set of the plurality of sets of tests being sequenced through in response to the output register signals and the output state signals.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1A:
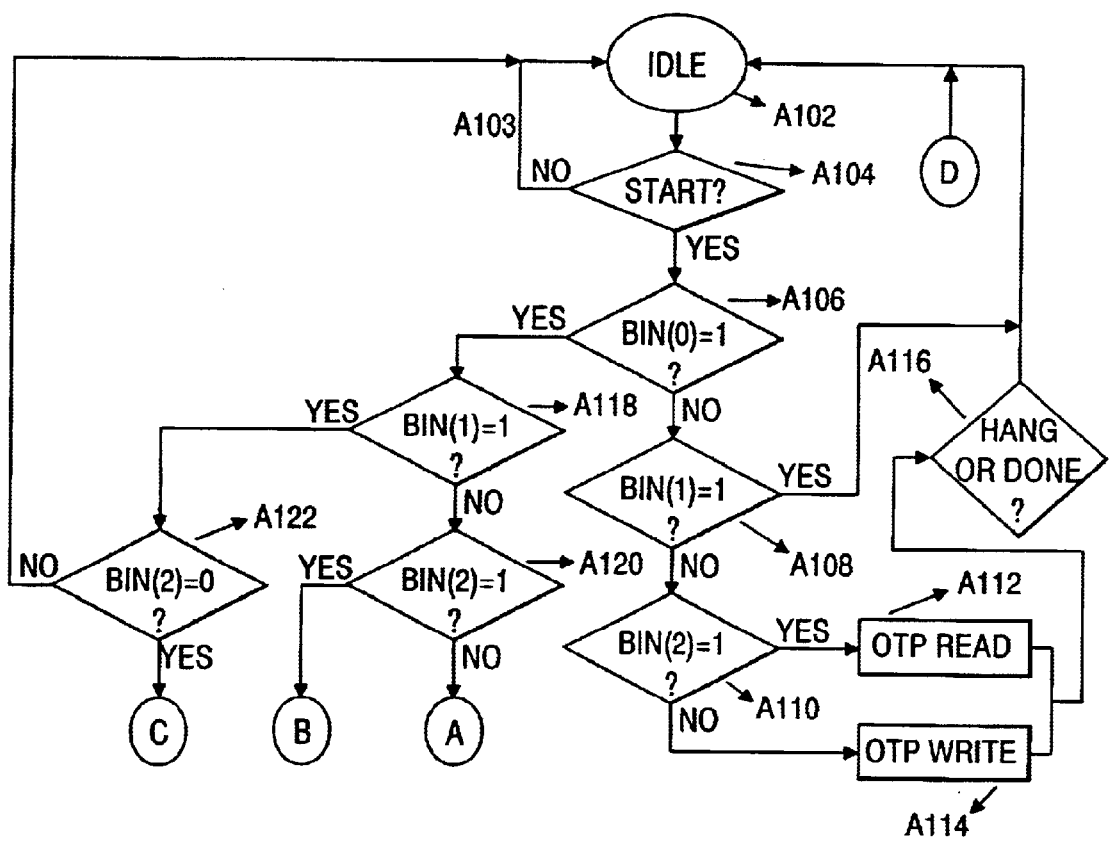
FIGS. 1(a) through 1(e), when connected together, is a flow chart of the logic functionality required to be implemented for a BIST frontend state machine.

As previously pointed out, flash IC chips manufacturers test the flash memory IC chips manually, which is tedious, time consuming and very costly. With this invention, it provides a self-testing mechanism within the flash chip so as to perform various types of tests before shipment to a consumer, thereby resulting in a higher reliability and very low cost, since the testing mechanism allows for testing with only minimal external hardware and minimal manual intervention. The testing on the whole is sometimes referred to as. built-in self-test (BIST). At times , the testing process is performed by a state machine under the control of a processor via an interface bus. The purpose of this invention is to implement the same logic functionality of a BIST frontend state machine illustrated in FIGS. 1(a)–1(e), but is achieved with a minimal amount of logic gates.

Before describing in detail the instant invention, it is believed that it would be helpful in understanding the principles of the present invention and to serve as a background by first explaining in more detail the logic functionality required to be implemented in the BIST frontend state machine with reference to FIGS. 1(a)–1(e). As can be seen in flow chart of FIG. 1(a), there is shown an idle block A102 which is the idle state for the BIST testing process. The BIST testing process remains in the idle state until it receives an activation signal which causes the process to move to a first decision block or START block A104. If the activation signal is in the "1" state, the process then moves to a BIN(0)=1 decision block A106. If the activation signal is in the "0" state, then the process returns to the idle state of the block A102 by the line A103 and waits for another activation signal going to a "1" state in order to initiate another BIST test sequence.

In the decision block A106, the state machine determines whether the output state or value of a first register BIN(0) is equal to "1". If the value of the first register is equal to "1", the process branches to decision box A118 to determine whether the output state or value of a second register BIN(1) is equal to "1". If the value of the second register is equal to "1", the process branches to decision box A122 to determine whether the output state or value of a third register BIN(2) is equal to "0". If the value of the third register is equal to "0", the process branches to a "CONNECTOR C" which continues the flow in FIG. 1(e). If the value of the third register BIN(2) is a "1", the process branches back to IDLE state A102.

From decision box A118, if the value of the second register BIN(1) is a value of "0", the process branches to decision box A120. In decision box A120, the value of the third register BIN(2) is checked for a value of "1". If the value of the third register BIN(2) is a value of "1", the process branches to "CONNECTOR B" which continues the flow in FIG. 1(c). In decision box A120, if the value of the third register BIN(2) is a "0", then the process branches to "CONNECTOR A" which continues the flow in FIG. 1(b).

In decision box A106, when the first register BIN(0) is checked for a value of "1", if the register contain a value of "0", the process branches to decision box A108, which checks for a value of "1" on the second register BIN(1). If the content of the second register BIN(1) have a value of "1", the process branches back to IDLE mode A102. If the content of the second register BIN(1) have a value of "0", the process branches to decision box A110 which check for the value of "1" in the third register BIN(2). If this third register BIN(2) have a value of "1", the process branches to mode OTP (One Time Protect) READ block A112. If the content of the third register BIN(2) is "0", the process branches to mode OTP Write block A114.

From mode block A112 and A114, the process proceed. to decision box A116 which detect for a HANG or DONE condition. When the HANG or DONE condition is met, the process branches back to the IDLE mode A102.

Figure 1B:
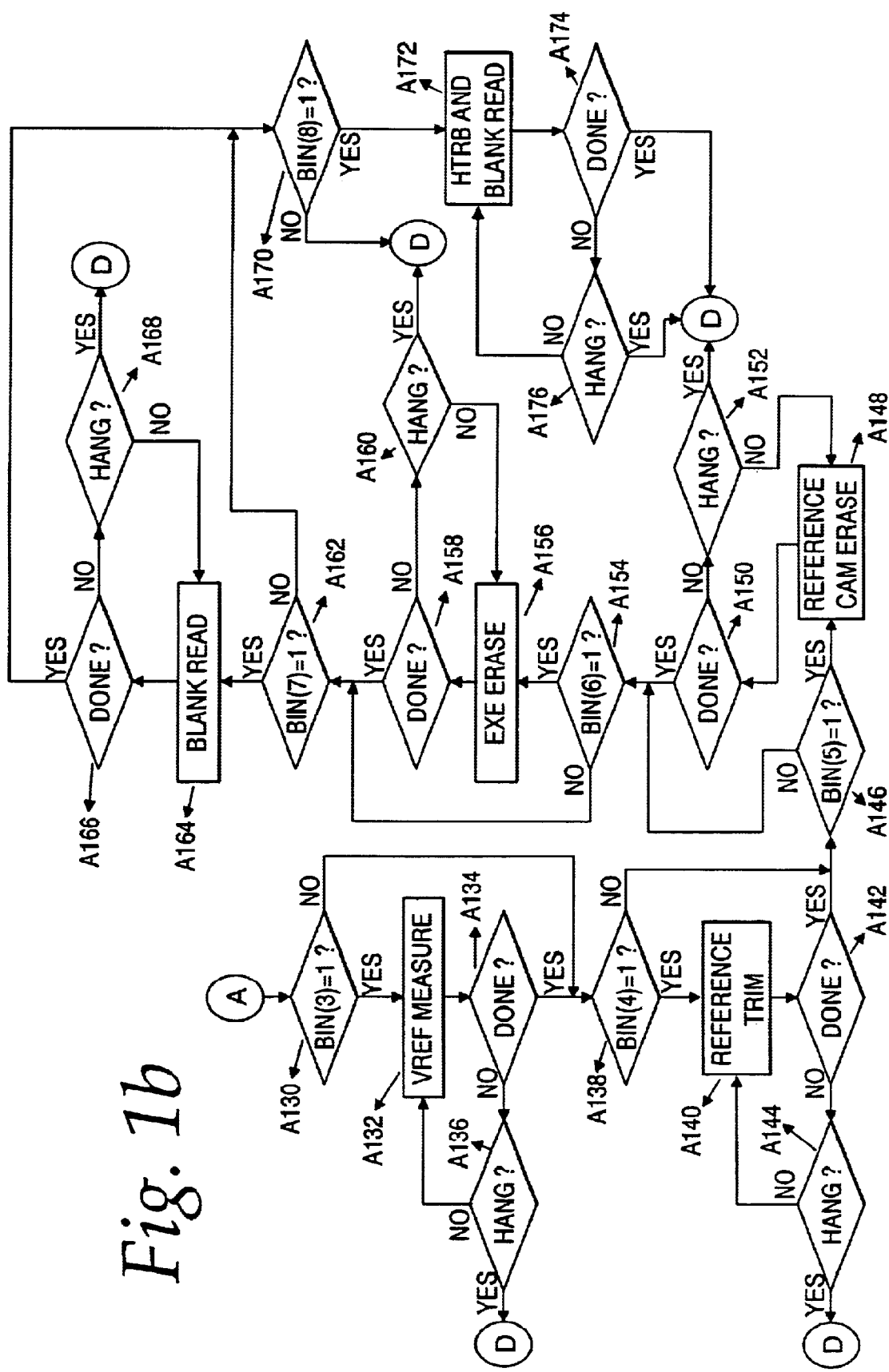

FIG. 1(b) shows a continuation of the process flowchart from "CONNECTOR A". From "CONNECTOR A" branches to decision box A130 which checks for value of fourth register BIN(3) to determine if it contains a value of "1". If this. is not true, the process branches to decision box A138. If the value of the fourth register BIN(3) has a value of "1", the process-branches to block "Vref Measure" mode A132. From block A132, the process branches to decision box A134 which checks for the condition of DONE. If the condition of DONE is present, the process branches to decision box A138. If the condition of DONE is not present, the process branches to decision box A136 to check for the condition of HANG. If the condition of HANG is present, the process branches back to IDLE mode block A102 through "CONNECTOR D". If the condition of HANG is not present, the process branches back to block A132. The loop of block A132, A134, A136 and back to block A132 will continue to loop indefinitely until either a condition of HANG or DONE is present.

At decision box A138, the value of fifth register BIN(4) is checked. If the value is a "0", the process branches to decision box A146. If the value is a "1", the process branches to mode "Reference Trim" block A140. From block A140, the process branches to decision box A142 which checks for a condition of DONE. If the condition of DONE is present, the process branches to decision box A146. If the condition of DONE. is not present, the process branches to decision box A144 which checks for the condition of HANG. If HANG is present, the process branches back to IDLE mode block A102 through "connector D". If the condition of HANG is not present, the process branches back to mode "Reference Trim" block A140. The loop of block A140, A142, A144 and back to block A140 will loop until the condition of either HANG or DONE is met.

At decision box A146, the value of sixth register BIN(5) is checked. If the value is a "0", the process branches to decision box A154. If the value is a "1", the process branches to mode "Reference CAM Erase" block A148. From this block, the process branches to decision box A150 which checks for the condition of DONE. If the condition of DONE is present, the process branches to decision box A154. If the condition DONE is not present, the process branches to decision box A152 which checks for the condition of HANG. If the condition HANG is present, the process branches to mode IDLE block A102 through "CONNECTOR D". If the condition of HANG is not present, the process branches back to mode "Reference CAM Erase" block A148. The loop of block A148, A150, A152 and back to A148 will continue to loop until either a condition of DONE or HANG is present.

Decision box A154 checks for the value of the seventh register BIN(6). If the value is a "0", the process branches to decision box A162. If the value is a "1", the process branches to mode "EXE Erase" block A156. From block A156, the process branches to decision box A158 which checks for the condition DONE. If the condition DONE is present, the process branches to decision box A162. If the condition DONE is not present, the process branches to decision box A160 which checks for the condition of HANG. If the condition of HANG is present, the process branches back to mode IDLE block A102 through "CONNECTOR D". If the condition of HANG is not present, the process branches back to mode "EXE Erase" block A156. The loop of block A156, A158, A160 and back to A156 will continue to loop until either a condition of HANG or DONE is present.

At decision box A162, the value of the eighth register BIN(7) is checked. If it has a value of "0", the process branches to decision box A170. If the value is a "1", the process branches to mode "Blank Read" block A164. From here, the process branches to decision box A166 which checks for the condition of DONE. If the condition of DONE is present, the process branches to decision box A170. If the condition DONE is not present, the process branches to decision box A168 which checks for the condition of HANG. If the condition of HANG is present, the process branches back to mode IDLE block A102. If the condition of HANG is not present, the process branches to mode "Blank Read" block A164. The loop of A164, A166, A168 and back to A164 will loop until either a condition of HANG or DONE is met.

At decision box A170, the value of the ninth register BIN(8) is checked. If the value is a "0", the process branches back to mode IDLE block A102 through the "CONNECTOR D". If the value is a "1", the process branches to mode "HTRB and Blank Read" block A172. From block A172, the process branches to decision box A174 which checks for the condition of DONE. If the condition of DONE is present, the process branches back to mode IDLE block A102 through "CONNECTOR D". If the condition of DONE is not present, the process branches to decision box A176 which checks for the condition of HANG. If the condition is present, the process branches back to mode IDLE block A102 through "CONNECTOR D". If the condition of HANG is not present, the process branches back to mode "HTRB and Blank Read" block A172. This loop of block A172, A174, A176 and back to A172 will loop until either a condition of HANG or DONE is present.

Figure 1C:
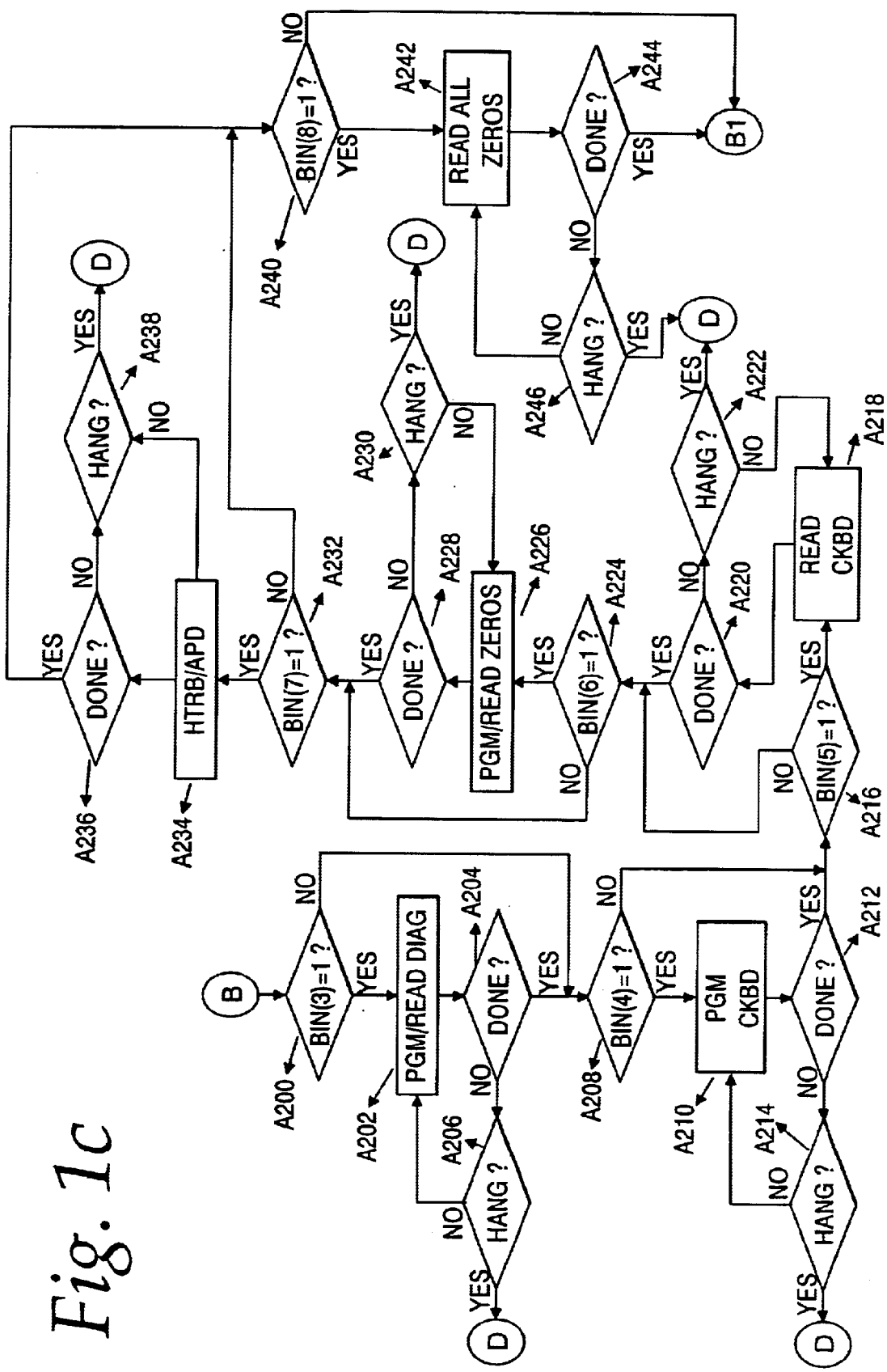

FIG. 1(c) shows the "CONNECTOR B" connecting to decision box A200 which checks for the value of the fourth register BIN(3). If the value is a "0", the process branches to decision box A208. If the value is a "1", the process branches to mode "Pgm/Read Diag" block A202. From block A202, the process branches to decision box A204 which checks for the condition of DONE. If the condition DONE is present, the process branches to decision box A208. If the condition DONE is not present, the process branches to decision box A206 which checks for the condition of HANG. If the condition HANG is present, the process branches back to mode IDLE block A102 through "CONNECTOR D". If the condition of HANG is not present, the process branches back to mode "Pgm/Read Diag" block A202. The loop of block A202, A204, A206 and back to A202 will loop until either a condition of HANG or DONE occurs.

Decision box A208 checks the value of the fifth register BIN(4) . If the register have a value of "0", the process branches to decision box A216. If the register have a value of "1", the process branches to mode "Pgm Ckbd" block A210. From block A210, the process branches to decision box A212 to check for the condition of DONE. If the condition DONE is present, the process branches to decision box A216. If the condition DONE is not present, the process branches to decision box A214 which checks for the condition of HANG. If the condition HANG is present, the process branches back to mode IDLE block A102 through "CONNECTOR D". If the condition of HANG is not present, the process branches back to mode "Pgm Ckbd" block A210. The loop of block A210, A212, A214 and back to A210 will loop until either a condition of HANG or DONE is met.

Decision box A216 checks. the value of the sixth register BIN(5) . If the register have a value of "0", the process branches to decision box A224. If the register have a value of "1", the process branches to mode "Read Ckdb" block A218. From here, the process branches to decision box A220 which checks for the condition of DONE. If the condition DONE is present, the process branches to decision box A224. If the condition DONE is not present, the process branches to decision box A222 which checks for the condition of HANG. If the condition HANG is present, the process branches back to mode IDLE block A102. If the condition HANG is not present, the process branches back to mode "Read Ckbd" block A218. The loop of block A218, A220, A222 and back to A218 loops until either a condition of HANG or DONE is present.

Decision box A224 checks for the value of the seventh register BIN(6). If the register have a value of "0", the process branches to decision box A232. If the register have a value of "1", the process branches to mode "Pgm/Read Zeros" block A226. From this block, the process branches to decision box A228 that checks for a condition of DONE. If the condition of DONE is present, the process branches to decision box A232. If the condition DONE is not present, the process branches to decision box A230 which checks for the condition of HANG. IF the condition of HANG is present, the. process branches back to mode IDLE block A102. If the condition HANG is not present, the process branches back to mode "Pgm/Read Zeros" block A226. The loop of block A226, A228, A230 and back to block A226 will loop until either a condition of HANG or DONE is met.

Decision box A232 checks for the value of the eighth register BIN(7). If the value of the register is a "0", the process branches to decision box A240. If the value of the register is a "1", the process branches to mode "HTRB/ APD" block A234. From block A234, the process branches to decision box A236 which checks for a condition of DONE. If the condition DONE is present, the process branches to decision box A240. If the condition of DONE is not present, the process branches to decision box A238 which checks for the condition of HANG. If the condition HANG is present, the process branches back to 20 IDLE mode block A102. If the condition HANG is not present, the process branches back to mode "HTRB/APD" block A234. Block A234, A236, A238 and back to block A234 will loop until either a condition of HAND or DONE is met.

Decision box A240 checks for the value of ninth register BIN(8) . If the register have a value of "0", the process branches to "CONNECTOR B1" which is connected to FIG. 1(d). If the register have a value of "1", the process branches to mode "Read All Zeros" block A242. From this block, the process branches to decision box A244 which checks for the condition of DONE. If the condition DONE is present, the process branches to "CONNECTOR B1" which is connected to FIG. 1(d). If the condition DONE is not present, the process branches to decision box A246 which checks for the condition HANG. If the condition HANG is present, the process branches back to mode IDLE block A102. If the condition HANG is not present, the process branches back to mode "Read All Zeros" block A242. This loop of block A242, A244, A246 and back to block A242 will loop until either a condition of HANG or DONE is met.

Figure 1D:
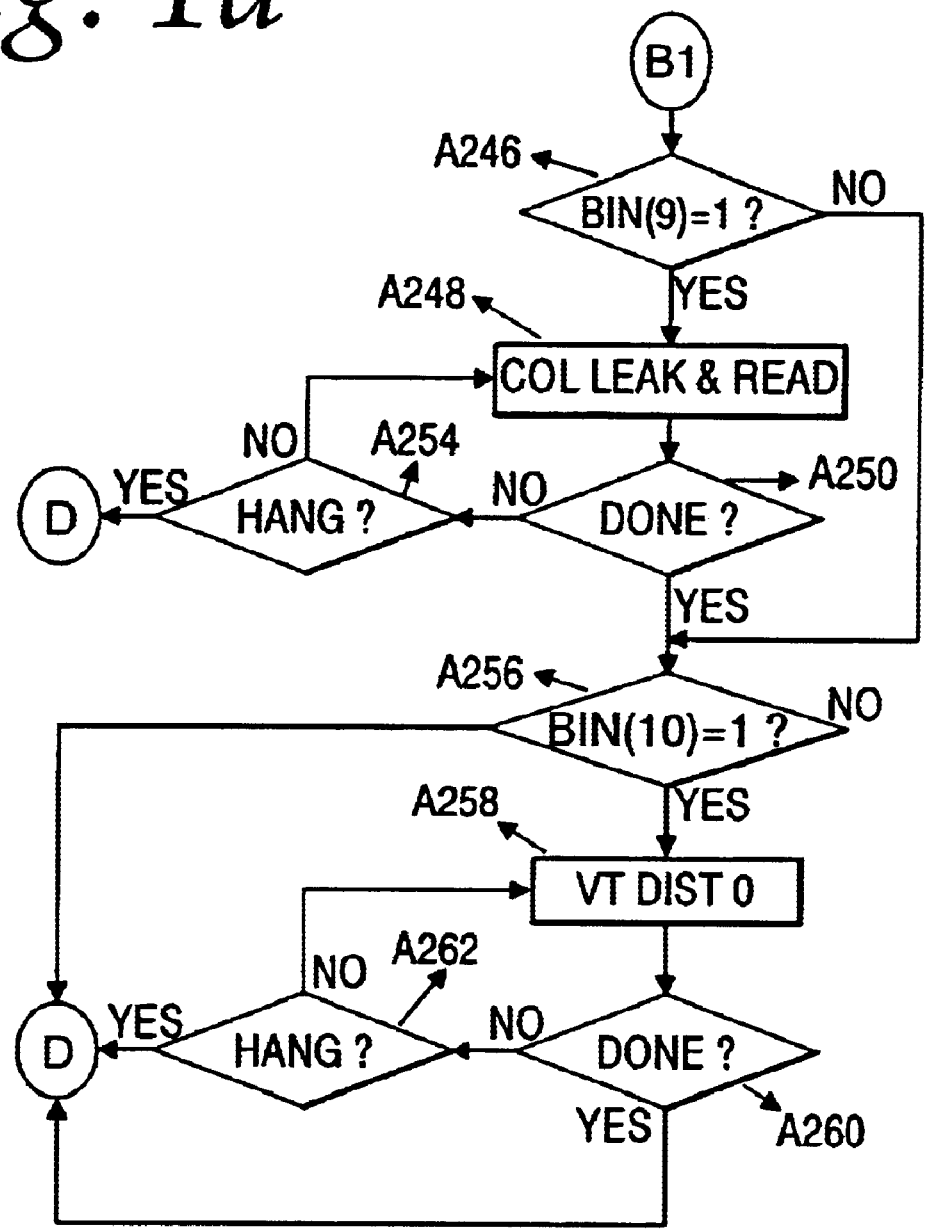

FIG. 1(d) continues to decision box A246 which checks the value of the tenth register BIN(9) . If the register have a value of "0", the process branches to decision box A256. If the register have a value of "1", the process branches to mode "Col Leak & Read" block A248. From this block, the process branches to block A250 which checks for the condition of DONE. If the condition DONE is present, the process branches to decision box A256. If the condition of DONE is not present, the process branches to decision box A254 which checks for the condition of HANG. If the condition of HANG is present, the process branches back to mode IDLE block A102. If the condition of HANG is not present, the process branches back to mode "Col Leak & Read" block A248. This loop of block A248, A250, A254 and back to block A248 loops until a condition of DONE or HANG is met.

Decision box A256 checks the value of the eleventh register BIN(10) . If the value is a "0", the process branches to mode IDLE block A102. If the value is a "1", the process branches to mode "Vt Dist 0" block A258. From this block, the process branches to decision block A260 which checks for the condition of DONE. If the condition DONE is present, the process branches to mode IDLE block A102 through "CONNECTOR D". If the condition of DONE is not present, the process branches to decision box A262 which checks for the condition of HANG. If the condition of HANG is present, the block branches to mode IDLE block A102 through "CONNECTOR D". If the condition of HANG is not present, the process branches to mode "Vt Dist 0" block A258. The loop of block A258, A260, A262 and back to block A258 loops until either. the condition of HANG or DONE is met.

Figure 1E:
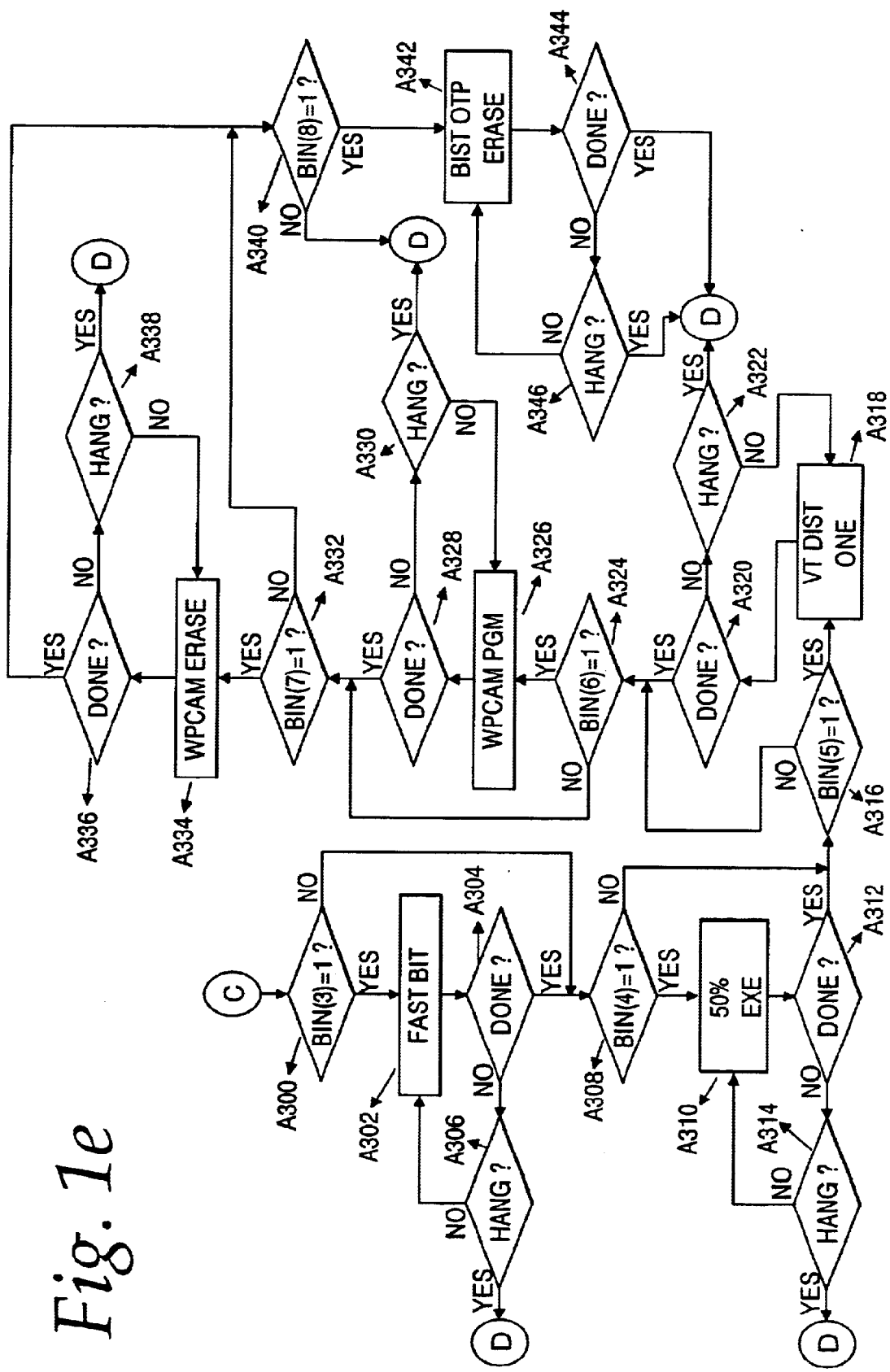

FIG. 1(e) is the continuation of the process flow with "CONNECTOR C". The connector connects to decision box A300 which checks the value of the fourth register BIN(3). If the register has a value of "0", the process branches to decision box A308. If the value is a "1", the process branches to mode "Fast Bit" block A302. From this block, the process branches to decision box A304 which checks for the condition of DONE. If the DONE condition is present, the process branches to decision box A308. If the DONE condition is not present, the process branches to decision box A306 which checks for the condition of HANG. If the condition HANG is present, the process branches back to mode IDLE block A102. If the condition HANG is not present, the process branches back to mode "Fast Bit" block A302. This loop of block A302, A304, A306 and back to block A302 loops until either a condition of HANG or DONE is met.

Decision box A308 checks for the value of the fifth register BIN(4) . If the value is a "1", the process branches to block A310 "50% EXE" mode. If the value is a "0", the process branches to decision box A316. From this block, the process branches to decision box A312 which checks for the condition of DONE. If the condition DONE is present, the process branches to decision block A316. If the condition DONE is not present, the process branches to decision block A314 which checks for the condition of HANG. If the condition HANG is present the process branches back to mode IDLE block A102 through "CONNECTOR D". If the condition HANG is not present, the process branches back to mode "50% EXE" block A310. The loop of block A310 to block A312 and back to block A314 will loop until either a condition of HANG or DONE is met.

Decision box A316 checks for the value of sixth register BIN(5). If the value is a "1", the process branches to mode "Vt Dist One" block A318. If the value is a "0", the process branches to decision block A324. From this block, the process moves to decision box A320 which checks for the condition of DONE. If the condition DONE is present, the process branches to decision block A324. If the condition DONE is not present, the process branches to decision box A322 which checks for the condition of HANG. If the condition HANG is present, the process branches back to mode IDLE block A102 using "CONNECTOR D". If the condition HANG is not present, the process branches back to mode "Vt Dis One" block A318. This loop of block A318, A320, A322 and back to block A318 loops until either a condition of HANG or DONE is met.

Decision box A324 checks the value of seventh register BIN(6). If the value is a "1", the process branches mode "WPCAM Pgm" block A326. If the value is a "0", the process branches to decision box A332. From mode "WPCAM Pgm" block A326, the process branches to decision box A328 which checks for the condition. DONE. If the condition DONE is present, the process branches to decision box A332. If the condition DONE is not present, the process branches to decision box A330 which checks for the condition HANG. If the condition HANG is present, the process branches back to mode IDLE block A102 through "CONNECTOR D". If the condition HANG is not present, the process branches back to mode "WPCAM Pgm" block A326. The loop of block. A326, A328, A330 and back to block A326 will iterate until either a condition of HANG or DONE is met.

Decision box A332 checks the value of eighth register BIN(7). If the value of the register is a "0", the process branches to decision box A340. If the value is a "1", the process branches to mode "WPCAM Erase" block A334. From this block, the process moves to decision box A336 which checks for the condition DONE. If the condition DONE is present, the process branches to decision box A340. If the condition DONE is not present, the process branches to decision box A338 which checks for the condition HANG. If the condition HANG is present, the process branches to mode IDLE block A102 through "CONNECTOR D". If the condition HANG is not present, the process branches back to mode "WPCAM Erase" block A334. The loop of block A334 to block A336, A338 and back to block A334 will loop until either a condition of HANG or DONE is met.

Decision box A340 checks the value of ninth register BIN(8). If the value is a "0", the process branches back to mode IDLE block A102. If the value is a "1", the process branches to mode "BIST OTP Erase" block A342. From block A342, the process branches to decision box A344 which checks for the condition DONE. If the condition DONE is present, the process branches back to mode IDLE block A102 through "CONNECTOR D". If the condition DONE is not present, the process branches to block A346 which checks for the condition HANG. If the condition HANG is present, the process branches back to mode IDLE block A102. If the condition HANG is not present, the process branches back to mode "BIST OTP Erase" block A342. The loop of block A342, A344, A346 and back to block A342 iterates until either a condition of HANG or DONE is met.

It will be noted from FIGS. 1(a)–1(e) that the logic functionality if implemented using a conventional state machine would require quite a large amount of test logic circuitry. This is because of the many different logic states as well as the many different logic gates that would be needed to implement each of the decision blocks in FIG. 1(a), 1(b), 1(c), 1(d) and 1(e) The inventors of the present invention have developed a technique of obtaining the same logic functionality required of the BIST frontend state machine which requires much less I.C. chip space or area to implement in comparison to using the conventional state machine. This is accomplished by utilizing a combination of shift registers, a clocked state machine, and sharing logic gates in order to reduce substantially the amount of electrical circuit components, thereby minimizing the chip area cost.

Figure 2:
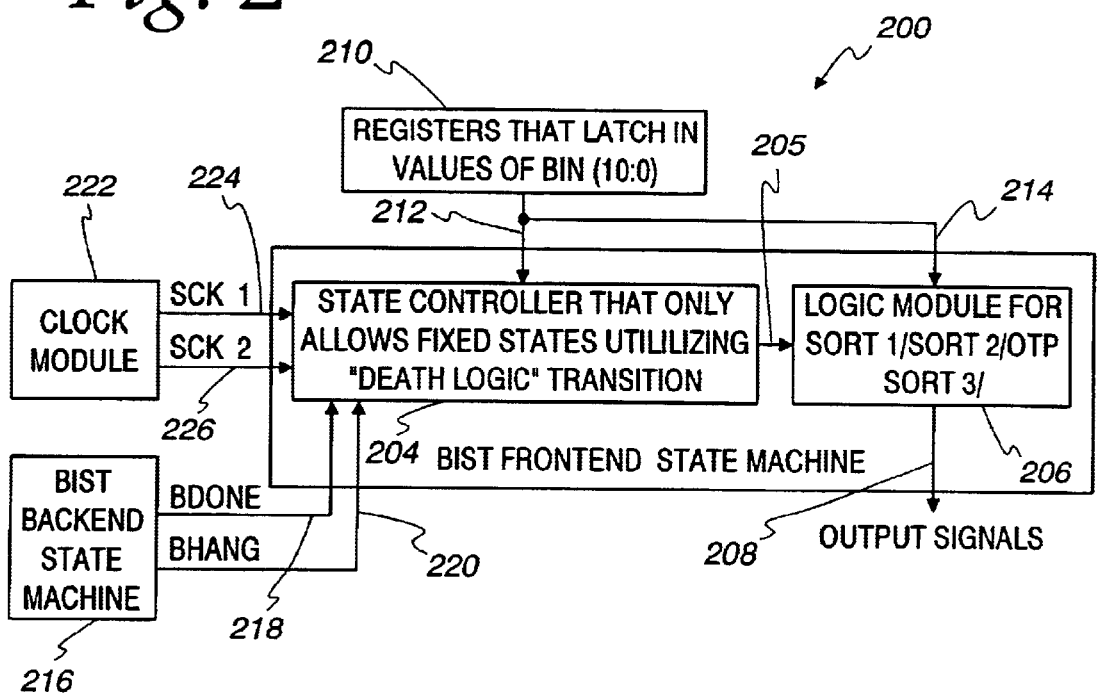
FIG. 2 is a general overall block diagram of a BIST frontend state machine, constructed in accordance with the principles of the present invention.

In FIG. 2, there is illustrated a general overall block diagram of a frontend state machine 200, constructed in accordance with the principles of the present invention. The frontend state machine 200 includes a plurality of shift registers 210 for storing the values of the registers BIN (10:0) that are inputted by a user. The shift registers 210 generate output register signals corresponding to a particular one of a plurality of sets of tests to be executed. A clock module 222 is used to generate two-phase non-overlapping clock signals. A first clock signal SCK1 is provided on line 224, and a second clock signal SCK2 is provided on line 226. A BIST backend state machine 216 is provided which is used to generate control signals formed of a BDONE signal on line 218 and a BHANG signal on line 220. These control signals are used to indicate whether a particular test in the set of tests is still being executed, has been completed, or has failed.

The frontend state machine 200 further includes a BIST frontend state machine 202 formed of a state controller 204 and a logic module 206. The state controller 204 receives as inputs the clock signals SCK1, SCK2; the control signals BDONE and BHANG; and the output register signals on line 212. The state controller is used to generate output state signals on line 208 which are based upon a fixed number of states utilizing a so-called "death logic" transition so as to sequence through one of the plurality of sets of tests, as determined by the values loaded in the registers 210. A particular test is continued to be executed until either the BDONE signal on the line 218 indicative of a completed test or the BHANG signal on the line 220 indicative of a failed test is generated. The logic module 206 receives both the output register signals on the line 214 and the output state signals on the line 205 in order to generate output test signals on line 208. The logic module determines which one of the modes of operation is-to executed, such as the OTP mode, SORT1 mode, SORT2 mode, or SORT3 mode. In the sort modes of operation, the output test signals are required for each of the particular test being sequenced through.

Figure 3A:
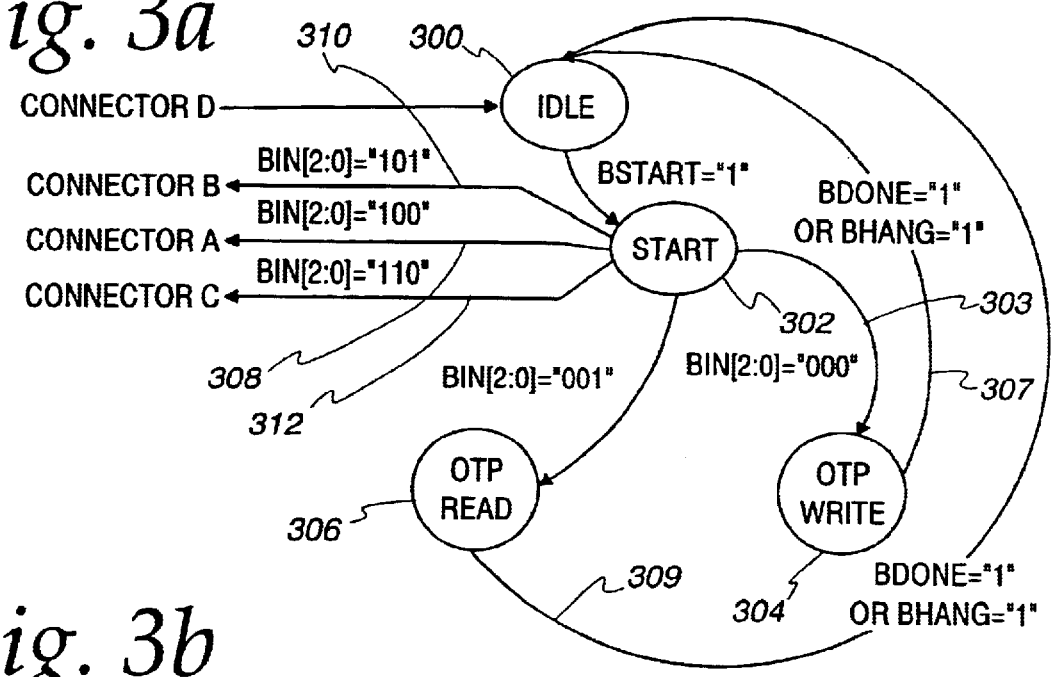
FIGS. 3(a) through 3(d) are state diagrams of exemplary sequence of state transitions to be executed by the state machine of the present invention in FIG. 2.
Figure 3B:
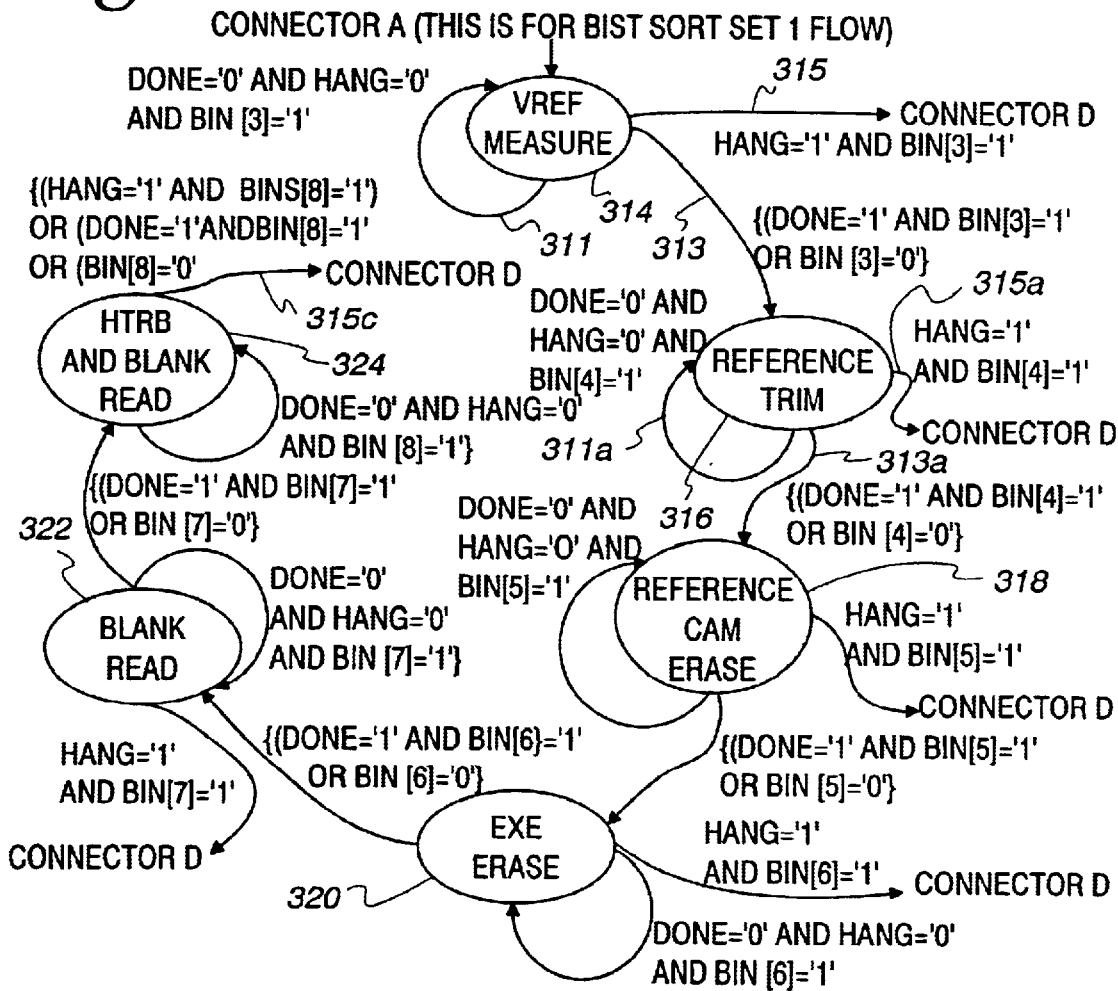
Figure 3C:
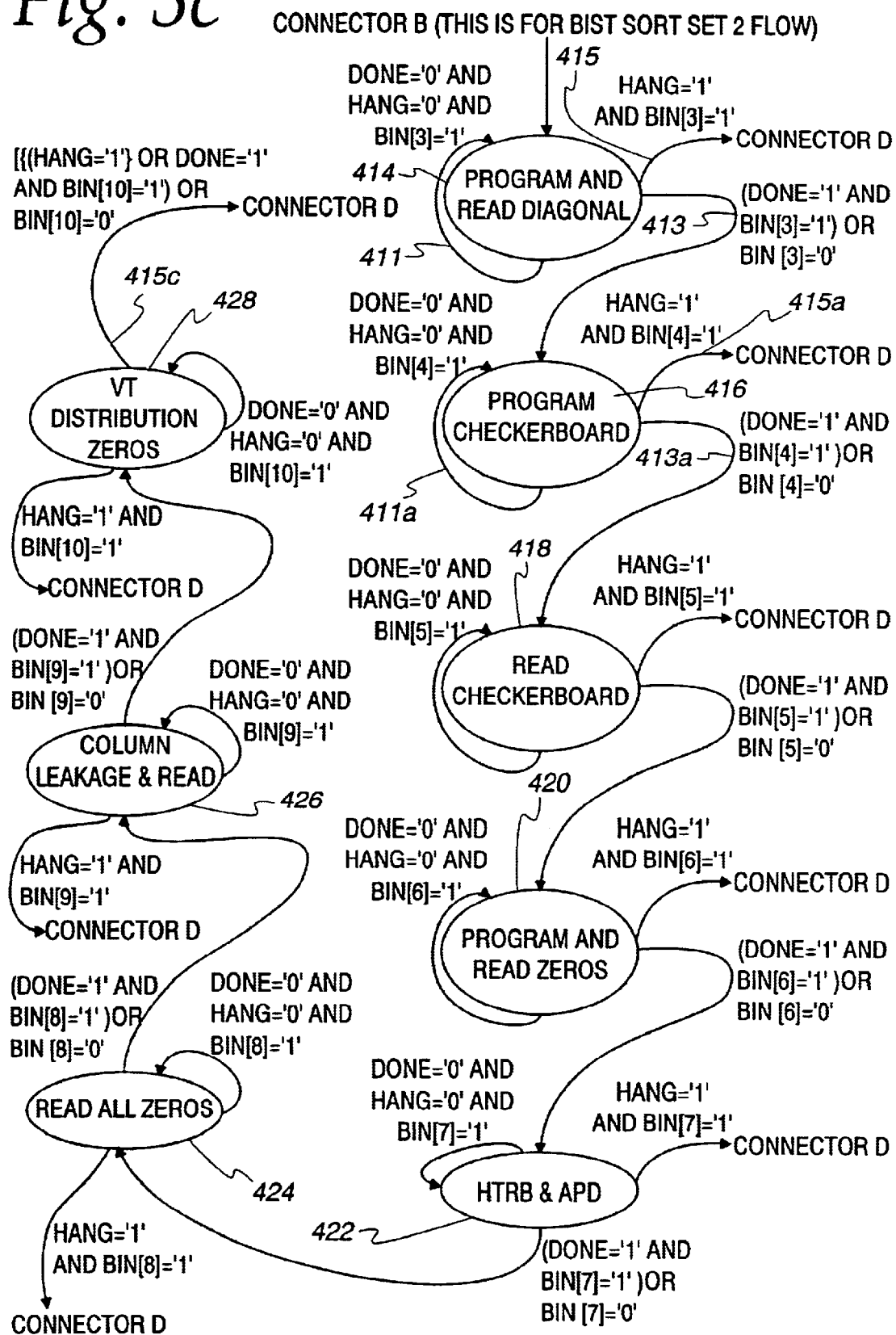
Figure 3D:
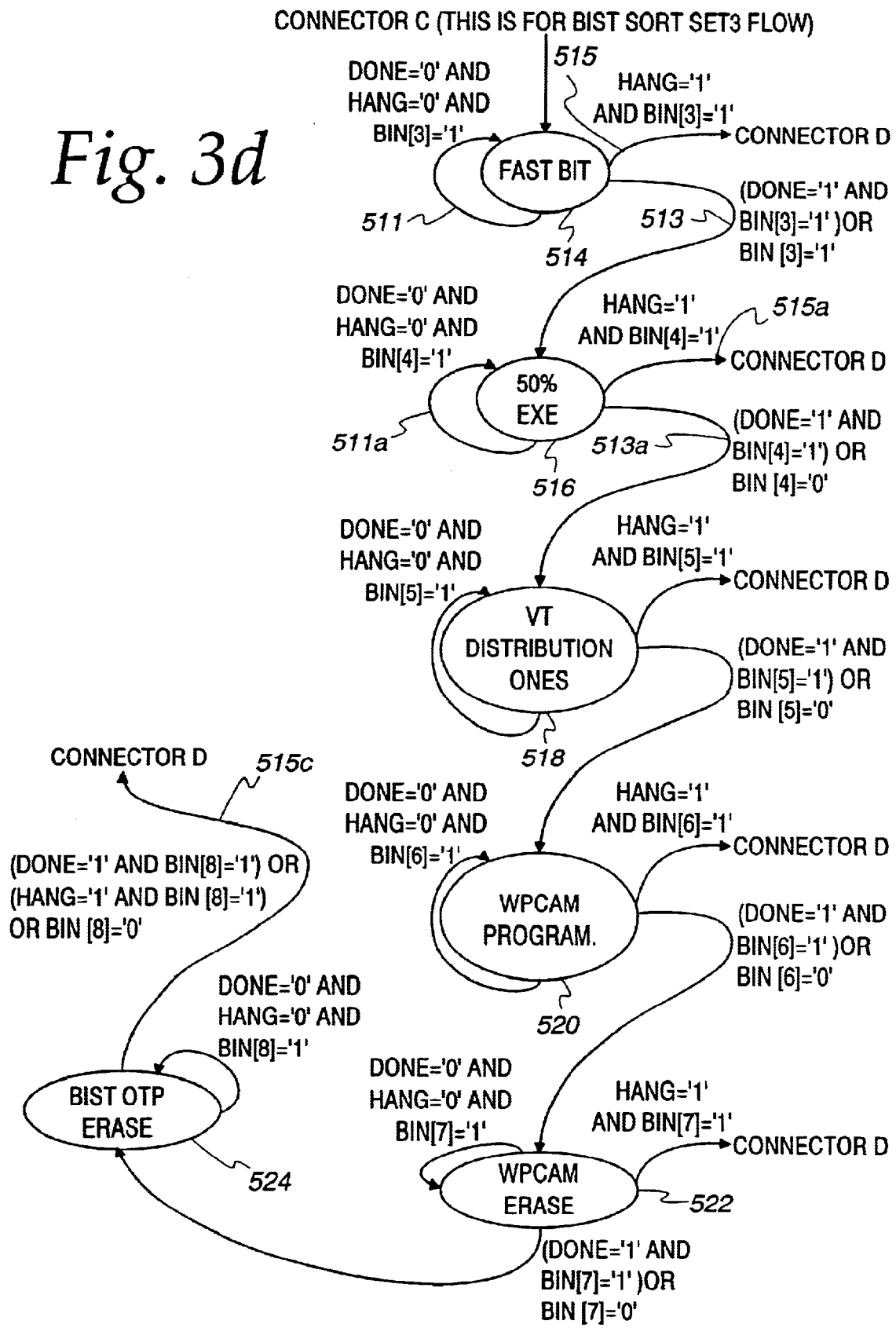

In FIGS. 3(a)–3(d), there are depicted state diagrams of exemplary sequences of state transitions to be executed by the frontend state machine 202 of the present invention in FIG. 2. As can be seen in FIG. 3(a), there is shown an Idle state 300 which is the beginning state of the frontend state machine 202 for the BIST testing process. The state machine remains in the IDLE state 300 until it receives a BSTART signal in the "1" state. Upon receiving the signal BSTART= 1, the state machine will move to a START state 302 on the next clock cycle from the clock module 222 (FIG. 2). Each transition from one state to the next state requires one clock cycle. The BSTART signal is generated by a tester interface (not shown) which is part of the circuitry under test. The tester interface is responsive to input commands issued by product test engineers and used to store information relative to the kinds of tests to be sequenced through and executed by the state machine.

In the START state 302, the state machine will jump to the next state dependent upon the values of BIN(2:0) stored in the shift register 210. If the values of BIN(2:0)=000 is detected by the state machine, then it will move to the OTP Write state 304 via arrow 303. If the values of BIN(2:0)=001 is detected, then the state machine will move to the OTP Read state 306 via arrow 305. If the values of BIN(2:0)=100 is detected, then the state machine will move to CONNECTOR A via arrow 308, which corresponds to BIST SORT SET1 flow of FIG. 3(b). If the values of BIN(2:0)=101 is detected, then the state machine will move to CONNECTOR B via arrow 310, which corresponds to BIST SORT SET2 flow of FIG. 3(c). If the values of BIN(2:0)=110 is detected, then the state machine will move to CONNECTOR C via arrow 312, which corresponds to BIST SORT SET3 flow of FIG. 3 (d) . It should be. noted that each of the state diagrams in FIGS. 3(b)–3(d)is actually the beginning point of a particular set of tests to be executed during the BIST testing process.

In the OTP Write state 304, a transition will be made via arrow 307 back to the IDLE state 300 if either a signal BDONE goes to a "1". or a signal BHANG goes to a "1".

The signal BDONE is essentially a "passed" signal indicating that a certain operation (test) has been completed successfully. The signal BHANG is essentially a "failed" signal indicating that a certain operation (test) was not performed successfully. Thus, only one of the signals (BDONE or BHANG) will be "1" at any one time. Similarly, in the OTP Read state 306, a transition will be made via arrow 309 back to the IDLE state 300 if either the signal BDONE goes to a "1" or the signal BHANG goes to a "1".

Assuming now that the values of BIN(2:0)=100, the state machine will move through and execute the sequence of transition states shown in FIG. 3 (b). This CONNECTOR A corresponds to the BIST SORT SET1 tests in which each test thereof is executed or not by checking sequentially the values of BIN(3:8) one bit at a time. Each bit in the BIN(3:8) represents an individual test in the particular set. If the bit is at "1", then the state machine must assert corresponding output state signals so as to execute the individual test. If the bit is at "0", then the state machine must not assert any signals and thus the particular test will not be executed.

Beginning with the first test state of "Vref measure" state 314, the state machine will check the value of BIN(3) to determine if it is at a "1". If BIN(3)=1, this indicates that the "Vref measure" test is to be executed and the state machine will generate the output state signals corresponding to this "Vref measure" test. Then, the state machine will monitor the signals BDONE and BHANG to determine if either one has gone to a "1". If neither signal has gone to a "1" (corresponding to BDONE=0 and BHANG=0), the state machine will continue to assert via arrow 311 the signals corresponding to the "Vref measure" test.

If the signal BDONE goes to a "1", this indicates the individual test has been passed. Thus, on the next clock cycle from the clock module 222 the state machine will move via arrow 313 to check the value of the next BIN or BIN(4) to determine if it is at a "1". On the other hand, if the signal BHANG goes to a "1", this indicates that the individual test has failed. Therefore, the state machine will then move back to the IDLE state 300 via arrow 315.

If the BIN(3)=0 is detected, this indicates that the "Vref measure" test is not to be executed and the state machine will move via the arrow 313 to check the next BIN or BIN(4). As will be noted, even though this "Vref measure" test is not to be executed when BIN(3)=0, the state machine will still be required to sequence through this state 314 in order to determine whether this individual test is required to be executed or not.

In the second test state or "Reference Trim" state 316, the state machine will repeat the above-described sequence for BIN(3) but with respect to bit BIN(4). In particular, in the second test state of "Reference Trim" state 316, the state machine will check the value of BIN(4) to determine if it is at a "1". If BIN(4)=1, this indicates that the "Reference Trim" test is to be executed and the state machine will generate the output state signals corresponding. to this "Reference Trim" test. Then, the state machine will monitor the signals BDONE and BHANG to determine if either one has gone to a "1". If neither signal has gone to a "1" (corresponding to BDONE=0 and BHANG=0), the state machine will continue to assert via arrow 311a the signals corresponding to the "Reference Trim" test.

If the signal BDONE goes to a "1", this indicates the individual test has been passed. Thus, on the next clock cycle from the clock module 222 the state machine will move via arrow 313a to check the value of the next BIN or BIN(5) to determine if it is at a "1". On the other hand, if the signal BHANG goes to a "1", this indicates that the individual test has, failed. Therefore; the state machine will then move back to the IDLE state 300 via arrow 315*a*.

If the BIN(4)=0 is detected, this indicates that the "Reference Trim" test is not to be executed and the state machine will move via the arrow 313*a* to check the next BIN or BIN(5). As will be noted, even though this "Reference Trim" test is not to be executed when BIN(4)=0, the state machine will still be required to sequence through this state 316 in order to determine whether this individual test is required to be executed or not.

In the third test state or "Reference CAM Erase" state 318, the state machine will repeat the above-described described sequence for BIN(3) but with respect to bit BIN(5). In the fourth test state or "EXE Erase" state 320, the state machine will repeat the above-described sequence for BIN(3) but with respect to bit BIN(6). In the fifth test state or "Blank Read" state 332, the state machine will repeat the above-described sequence for BIN(3) but with respect to bit BIN(7). In the sixth test state or "HTRB and Blank Read" state 324, the state machine will repeat the above-described sequence for BIN(3) but with respect to bit BIN(8). After the sixth test state, the state machine will move to the IDLE state 300 on the next clock cycle since this is the last test to be checked in this set of tests (i.e.,BIST SORT SET1).

Alternatively, assuming now that the values of BIN(2:0)= 101, the state machine will move through and execute the sequence of transition states shown in FIG. 3(*c*). This CONNECTOR B corresponds to the BIST SORT SET2 tests in which each test thereof is executed or not by checking sequentially the values of BIN(3:10) one bit at a time. Each bit in the BIN(3:10) represents an individual test in the particular set. If the bit is at "1", then the state machine must assert corresponding output state signals so as to execute the individual test. If the bit is at "0", then the state machine must not assert any signals and thus the particular test will not be executed.

Beginning with the first test state of "Program and Read Diagonal" state 414, the state machine will check the value of BIN(3) to determine if it is at a "1". If BIN(3)=1, this indicates that the "Program and Read Diagonal" test is to be executed and the state machine will generate the output state signals corresponding to this "Program and Read Diagonal" test. Then, the state machine will monitor the signals BDONE and BHANG to determine if either one has gone to a "1". If neither signal has gone to a "1" (corresponding to BDONE=0 and BHANG=0), the state machine will continue to assert via arrow 411 the signals corresponding to the "Program and Read Diagonal" test.

If the signal BDONE goes to a "1", this indicates the individual test has been passed. Thus, on the next clock cycle from the clock module 222 the state machine will move via arrow 413 to check the value of the next BIN or BIN(4) to determine if it is at a "1". On the other hand, if the signal BHANG goes to a "1", this indicates that the individual test has failed. Therefore, the state machine will then move back to the IDLE state 300 via arrow 415.

If the BIN(3)=0 is detected, this indicates that the "Program and Read Diagonal" test is not to be executed and the state machine will move via the arrow 413 to check the next BIN or BIN(4). As will be noted, even though this "Program and Read Diagonal" test is not to be executed when BIN(3)=0, the state machine will still be required to sequence through this state 414 in order to determine whether this individual test is required to be executed or not.

In the second test state or "Program Checkerboard" state 416, the state machine will repeat the above-described sequence for BIN(3) but with respect to bit BIN(4). In particular, in the second test state of "Program Checkerboard" state 416, the state machine will check the value of BIN(4) to determine if it is at a "1". If BIN(4)=1, this indicates that the "Program Checkerboard" test is to be executed and the state machine will generate the output-state signals corresponding to this "Program Checkerboard" test. Then, the state machine will monitor the signals BDONE and BHANG to determine if either one has gone to a "1". If neither signal has gone to a "1" (corresponding to BDONE=0 and BHANG=0), the state machine will continue to assert via arrow 411a the signals corresponding to the "Program Checkerboard" test.

If the signal BDONE goes to a "1", this indicates the individual test has been passed. Thus, on the next clock cycle from the clock module 222 the state machine will move via arrow 413*a* to check the value of the next BIN or BIN(5) to determine if it is at a "1". On the other hand, if the signal BHANG goes to a "1", this indicates that the individual test has failed. Therefore, the state machine will then move back to the IDLE state 300 via arrow 415*a*.

If the BIN(4)=0 is detected, this indicates that the "Program Checkerboard" test is not to be executed and the state machine will move via the arrow 413*a* to check the next BIN or BIN(5). As will be noted, even though this "Program Checkerboard" test is not to be executed when BIN(4)=0, the state machine will still be required to sequence through this state 416 in order to determine whether this individual test is required to be executed or not.

In the third test state or "Read Checkerboard" state 418, the state machine will repeat the above-described sequence for BIN(3) but with respect to bit BIN(5). In the fourth test state or "Program and Read Zero" state 420, the state machine will repeat the above-described sequence for BIN(3) but with respect to bit BIN(6). In the fifth test state or "HTRB and APD" state 422, the state machine will repeat the above-described sequence for BIN(3) but with respect to bit BIN(7). In the sixth test state or "Read All Zeros" state 424, the state machine will repeat the above-described sequence for BIN(3) but with respect to bit BIN(8). In the seventh test state or "Column Leakage and Read" state 426, the state machine will repeat the above-described sequence for BIN(3) but with respect to bit BIN(9). In the eighth test state or "VT Distribution Zeros" state 428, the state machine will repeat the above-described sequence for BIN(3) but with respect to bit BIN(10). After the eighth test state, the state machine will move to the IDLE state 300 on the next clock cycle since this is the last test to be checked in this set of tests (i.e.,BIST SORT SET2).

Alternatively, assuming now that the values of BIN(2:0)= 110, the state machine will move through and execute the sequence of transition states shown in FIG. 3(*d*). This CONNECTOR C corresponds to the BIST SORT SET3 tests in which each test thereof is executed or not by checking sequentially the values of BIN(3:8) one bit at a time. Each bit in the BIN(3:8) represents an individual test in the particular set. If the bit is at "1", then the state machine must assert corresponding output state signals so as to execute the individual test. If the bit is at "0", then the state machine must not assert any signals and thus the particular test will not be executed.

Beginning with the first test state of "Fast Bit" state 514, the state machine will check the value of BIN(3) to determine if it is at a "1". If BIN(3)=1, this indicates that the "Fast Bit" test is to be executed and the state machine will generate the output state-signals corresponding to this "Fast Bit" test. Then, the state achine will monitor the signals BDONE and BHANG to determine if either one has gone to a "1". If neither signal has gone to a "1" (corresponding to BDONE=0 and BHANG=0), the state machine will continue to assert via arrow 511 the signals corresponding to the "Fast Bit" test.

If the signal BDONE goes to a "1", this indicates the individual test has been passed. Thus, on the next clock cycle from the clock module 222 the state machine will move via arrow 513 to check the value of the next BIN or BIN(4) to determine if it is at a "1". On the other hand, if the signal BHANG goes to a "1", this indicates that the individual test has failed. Therefore, the state machine will then move back to the IDLE state 300 via arrow 515.

If the BIN(3)=0 is detected, this indicates that the "Fast Bit" test is not to be executed and the state machine will move via the arrow 513 to check the next BIN or BIN(4). As will be noted, even though this "Fast Bit" test is not to be executed when BIN(3)=0, the state machine will still be required to sequence through this state 514 in order to determine whether this individual test is required to be executed or not.

In the second test state or "50% EXE" state 516, the state machine will repeat the above-described sequence for BIN(3) but with respect to bit BIN(4). In particular, in the second test state of "50% EXE" state 516, the state machine will check the value of BIN(4) to determine if it is at a "1". If BIN(4)=1, this indicates that the "50% EXE" test is to be executed and the state machine will generate the output state signals corresponding to this "50% EXE" test. Then, the state machine will monitor the signals BDONE and BHANG to determine if either one has gone to a "1". If neither signal has gone to a "1" (corresponding to BDONE=0 and BHANG=0), the state machine will continue to assert via arrow 511a the signals corresponding to the "50% EXE" test.

If the signal BDONE goes to a "1", this indicates the individual test has been passed. Thus, on the next clock cycle from the clock module 222 the state machine will move via arrow 513a to check the value of the next BIN or BIN(5) to determine if it is at a "1". On the other hand, if the signal BHANG goes to a "1", this indicates that the individual test has failed. Therefore, the state machine will then move back to the IDLE state 300 via arrow 515a.

If the BIN(4)=0 is detected, this indicates that the "50% EXE" test is not to be executed and the state machine will move via the arrow 513a to check the next BIN or BIN(5). As will be noted, even though this "50% EXE" test is not to be executed when BIN(4)=0, the state machine will still be required to sequence through this state 516 in order to determine whether this individual test is required to be executed or not.

In the third test state or "VT Distribution" state 518, the state machine will repeat the above-described sequence for BIN(3) but with respect to bit BIN(S). In the fourth test state or "WPCAM Program" state 520, the state machine will repeat the above-described sequence for BIN(3) but with respect to bit BIN(6). In the fifth test state or "WPCAM Erase" state 522, the state machine will repeat the above-described sequence for BIN(3) but with respect to bit BIN(7). In the sixth test state or "BIST OTP Erase" state 524, the state machine will repeat the above-described sequence for BIN(3) but with respect to bit BIN(8). After the sixth test state, the state machine will move to the IDLE state 300 on the next clock cycle since this is the last test to be checked in this set of tests (i.e.,BIST SORT SET3).

In view of the foregoing explanation, it can be noted. that the architectural implementation of the present frontend state machine still requires the checking of all of the corresponding bits (i.e., BIN(3:8). for the BIST SORT SET1 tests) even if only one individual test is to be executed. As a consequence, there is required the same large number of clock cycles regardless of the number of test to be executed. However, the flow of frontend state machine is "known". In other words, the possible transitions from one step to any one of several steps made by the state machine is limited to only two paths in the instant case and thus can be easily predicted. Specifically, one path is a "pass" and the other path is a "fail". Therefore, the design of the logic circuitry needed for the BIST testing process can be of a simple fixed logic which allows a minimal set of possibilities; namely, only two possibilities. As a result, only a small amount of logic gates is required for implementation. Consequently, there is realized a very small die size which reduces significantly the amount of die area and correspondingly the overall cost.

This present method of micro-architectural implementation for obtaining the required BIST functionality by utilizing only a limited number of possibilities. Thus, the logic circuitry required to obtain the BIST function is fixed and does not need to be changed which is referred herein as the "death logic" state transition method. In addition to the savings of space in the die area, the logic circuitry interconnected to the state machine can be easily reused over and over again. In the event that the kinds of tests are to be hanged or expanded, only the state machine is required to be modified which allows for increased efficiency.

From the foregoing detailed description, it can thus be seen that the present invention provides an improved BIST frontend state machine and a method for micro-architectural implementation of the same which is achieved with a minimal amount of test logic circuitry. The state machine includes a state controller responsive to clock signals, control signals, and output register signals for generating output state signals based upon a fixed number of states utilizing death logic transitions so as to sequence through a set of tests until completed or failed. In practice, it was found that a substantial savings of approximately 40% in the I.C. chip area was realized in comparison to the implementation by the conventional state machine While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A BIST frontend state machine comprising:

a shift register responsive to values inputted by a user for generating output register signals corresponding to which one of a plurality of sets of tests are to be executed;

clock means for generating two-phase non-overlapping clock signals;

backend state machine for generating controls signals indicative of whether an individual test is still being executed, has been completed, or has failed;

state controller responsive to said clock signals, said control signals, and said output register signals for generating output state signals based upon a fixed number of states utilizing logic transitions of a limited number so as to sequence through said one of said plurality of sets of tests until each individual test has been completed or failed;

a logic module responsive to said output register signals and said output state signals for generating output test signals required for each individual test of said one of the plurality of sets of tests being sequenced through;

the output register signals from said shift register being formed of a plurality of bits, said each bit of said plurality of bits corresponding to an individual test in said one of the plurality of sets of test;

each bit of said plulrality of bits being checked sequentially by said state controller to determine whether the individual test is to be executed or not;

the individual test being executed when the bit being checked is equal to a logic "1" and the individual test being not executed when the bit being checked is equal to a logic "0";

the individual test being executed continuously by said state controller until one of the first and second control signals goes to a logic "1", the first control signal corresponding to a "passed" test signal, the second control signal corresponding to a "failed" test signal; and the next bit of each bit of said plurality of bits being checked by said state controller on the next clock signal from said clock means when the "passed" test signal goes to a logic "1" to determine whether a next individual test is to be executed or not.

2. A method for a BIST frontend state machine comprising the steps of:

inputting values into a shift register by a user;

generating output register signals from the shift register corresponding to which one of a plurality of sets of tests are to be executed;

generating two-phase non-overlapping clock signals;

generating controls signals from a backend state machine indicative of whether an individual test is still being executed, has been completed, or has failed;

generating output state signals in response to said clock signals, said control signals, and said output register signals based upon a fixed number of states utilizing logic transitions of a limited number so as to sequence through said one of said plurality of sets of tests until each individual test has been completed or failed;

generating output test signals required for each individual test of said one of the plurality of sets of tests being sequenced through in response to said output register signals and said output state signals;

the output register signals from said shift register being formed of a plurality of bits, said each bit of said plurality of bits corresponding to an individual test in said one of the plurality of sets of test;

checking sequentially each bit of said plurality of bits to determine whether the individual test is to be executed or not;

executing the individual test when the bit being checked is equal to a logic "1" and not executing the individual test when the bit being checked is equal to a logic "0";

executing continuously the individual until one of the first and second control signals goes to a logic "1", the first control signal corresponding to a "passed" test signal, the second control signal corresponding to a "failed" test signal; and checking the next bit of each bit of said plurality of bits on the next clock signal when the "passed" test signal goes to a logic "1" to determine whether a next individual test is to be executed or not.

* * * * *

UNITED STATES PATENT AND TRADEMARK OFFICE
CERTIFICATE OF CORRECTION

PATENT NO.    : 6,622,274 B1
DATED         : September 5, 2003
INVENTOR(S)   : Weng F. Lee et al.

It is certified that error appears in the above-identified patent and that said Letters Patent is hereby corrected as shown below:

Column 2,
Line 26, change "upon a-fixed" to -- upon a fixed --;

Column 3,
Line 62, change "If this, is" to -- If this is --; and

Column 9,
Line 24, change "operation is-to" to -- operation is to --.

Signed and Sealed this

Eighteenth Day of November, 2003

JAMES E. ROGAN
*Director of the United States Patent and Trademark Office*